(12) United States Patent
Isshiki et al.

(10) Patent No.: US 11,135,842 B2
(45) Date of Patent: Oct. 5, 2021

(54) PIEZOELECTRIC ELEMENT, LIQUID EJECTING HEAD, AND PRINTER

(71) Applicant: SEIKO EPSON CORPORATION, Tokyo (JP)

(72) Inventors: Tetsuya Isshiki, Shiojiri (JP); Takayuki Yonemura, Suwa (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 16/800,708

(22) Filed: Feb. 25, 2020

(65) Prior Publication Data
US 2020/0269579 A1   Aug. 27, 2020

(30) Foreign Application Priority Data
Feb. 26, 2019   (JP) .............................. JP2019-032592

(51) Int. Cl.
*B41J 2/14*   (2006.01)
*H01L 41/187*   (2006.01)
*B41J 2/045*   (2006.01)

(52) U.S. Cl.
CPC ........... *B41J 2/14233* (2013.01); *B41J 2/045* (2013.01); *H01L 41/1876* (2013.01); *B41J 2002/14258* (2013.01); *B41J 2202/03* (2013.01)

(58) Field of Classification Search
CPC .................... B41J 2/14233; B41J 2/045; B41J 2002/14258; B41J 2202/03; B41J 2/1631; B41J 2/1628; B41J 2/1645; B41J 2/1646; B41J 2/1632; B41J 2/1635; B41J 2/1607; B41J 2/1623; B41J 2002/14362; B41J 2002/14241; B41J 2002/14491; H01L 41/1876
See application file for complete search history.

(56) References Cited

U.S. PATENT DOCUMENTS

| 6,140,746 A | 10/2000 | Miyashita et al. |
| 2011/0074890 A1* | 3/2011 | Miyazawa ............. B41J 2/1646 347/71 |

FOREIGN PATENT DOCUMENTS

JP   H09-223831 A   8/1997

OTHER PUBLICATIONS

IP.com search (Year: 2021).*

* cited by examiner

*Primary Examiner* — Lisa Solomon
(74) *Attorney, Agent, or Firm* — Chip Law Group

(57) ABSTRACT

A piezoelectric element includes a first electrode disposed at a base body, a second electrode, and a piezoelectric layer disposed between the first electrode and the second electrode. The piezoelectric layer includes a first piezoelectric layer containing a complex oxide having a perovskite structure that contains lead, zirconium, and titanium and a second piezoelectric layer containing a complex oxide having a perovskite structure that is denoted by formula (1) below. The first piezoelectric layer is disposed between the first electrode and the second piezoelectric layer and is preferentially oriented to (100) when the crystal structure of the first piezoelectric layer is assumed to be pseudo-cubic, $$x\text{Pb}(\text{Mg},\text{Nb})\text{O}_3\text{-}y\text{PbZrO}_3\text{-}z\text{PbTiO}_3 \qquad (1)$$

where in formula (1), $0<x,y,z<1$ and $x+y+z=1$.

7 Claims, 8 Drawing Sheets

FIG. 7

|  | COMPOSITION RATIO | | | ORIENTATION RATIO F (%) | RELATIVE PERMITTIVITY | AMOUNT OF RELATIVE DISPLACEMENT |
|---|---|---|---|---|---|---|
|  | PMN | PZ | PT |  |  |  |
| COMPARATIVE EXAMPLE 1 | 0 | 52 | 48 | 90.9 | 603 | 1.00 |
| EXAMPLE 1 | 6 | 50 | 44 | 92.8 | 598 | 1.17 |
| EXAMPLE 2 | 6 | 35 | 59 | 92.0 | 398 | 0.97 |
| EXAMPLE 3 | 6 | 40 | 54 | 92.3 | 456 | 1.06 |
| EXAMPLE 4 | 6 | 44 | 50 | 91.4 | 497 | 1.14 |
| EXAMPLE 5 | 6 | 55 | 39 | 92.3 | 523 | 1.09 |
| EXAMPLE 6 | 10 | 30 | 60 | 83.3 | 522 | 1.00 |
| EXAMPLE 7 | 10 | 36 | 54 | 79.1 | 523 | 1.10 |
| EXAMPLE 8 | 10 | 42 | 48 | 80.2 | 538 | 1.11 |
| EXAMPLE 9 | 10 | 48 | 42 | 82.3 | 554 | 1.07 |
| EXAMPLE 10 | 10 | 54 | 36 | 81.5 | 535 | 1.01 |
| EXAMPLE 11 | 12 | 42 | 46 | 91.9 | 501 | 1.09 |
| EXAMPLE 12 | 15 | 29 | 56 | 79.8 | 565 | 0.99 |
| EXAMPLE 13 | 15 | 35 | 50 | 91.9 | 498 | 1.08 |
| EXAMPLE 14 | 15 | 41 | 44 | 75.0 | 569 | 1.07 |
| EXAMPLE 15 | 15 | 47 | 38 | 77.6 | 573 | 1.01 |
| EXAMPLE 16 | 15 | 53 | 32 | 79.6 | 594 | 1.01 |
| EXAMPLE 17 | 18 | 40 | 42 | 92.2 | 536 | 1.13 |
| EXAMPLE 18 | 23 | 32 | 45 | 93.6 | 578 | 1.01 |
| EXAMPLE 19 | 27 | 35 | 38 | 92.9 | 720 | 1.00 |
| EXAMPLE 20 | 30 | 20 | 50 | 85.8 | 580 | 1.00 |
| EXAMPLE 21 | 30 | 30 | 40 | 81.7 | 599 | 0.99 |
| EXAMPLE 22 | 30 | 40 | 30 | 93.1 | 677 | 0.93 |
| EXAMPLE 23 | 40 | 20 | 40 | 85.4 | 594 | 0.96 |
| EXAMPLE 24 | 45 | 10 | 45 | 87.3 | 623 | 0.87 |

PIEZOELECTRIC ELEMENT, LIQUID EJECTING HEAD, AND PRINTER

The present application is based on, and claims priority from JP Application Serial Number 2019-032592, filed Feb. 26, 2019, the disclosure of which is hereby incorporated by reference herein in its entirety.

BACKGROUND

1. Technical Field

The present disclosure relates to a piezoelectric element, a liquid ejecting head, and a printer.

2. Related Art

Typical examples of the liquid ejecting head include ink jet recording heads in which ink in a pressure generation chamber is pressurized by a vibrating plate deformed by a piezoelectric element and is ejected as ink droplets through a nozzle hole.

Examples of the piezoelectric element usable for ink jet recording heads include piezoelectric elements formed by interposing, between two electrodes, a piezoelectric material having an electromechanical conversion function, for example, a piezoelectric layer composed of a crystallized dielectric material.

For example, JP-A-9-223831 describes a piezoelectric element including a piezoelectric layer composed of a piezoelectric material including $Pb(Mg_{1/3},Nb_{2/3})O_3$, $PbZrO_3$ and, $PbTiO_3$.

The piezoelectric layer including $Pb(Mg,Nb)O_3$, $PbZrO_3$ and, $PbTiO_3$ above is not readily oriented compared with a piezoelectric layer composed of, for example, lead zirconate titanate ($Pb(Zr,Ti)O_3$:PZT). When the piezoelectric layer is not oriented, cracking may readily occur in the piezoelectric layer, or a leakage current may increase.

SUMMARY

According to an aspect of the present disclosure, a piezoelectric element includes a first electrode disposed at a base body, a second electrode, and a piezoelectric layer disposed between the first electrode and the second electrode, in which the piezoelectric layer includes a first piezoelectric layer containing a complex oxide having a perovskite structure that contains lead, zirconium, and titanium and a second piezoelectric layer containing a complex oxide having a perovskite structure that is denoted by formula (1) below, and the first piezoelectric layer is disposed between the first electrode and the second piezoelectric layer and is preferentially oriented to (100) when a crystal structure of the first piezoelectric layer is assumed to be pseudo-cubic,

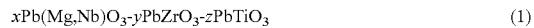

$$xPb(Mg,Nb)O_3\text{-}yPbZrO_3\text{-}zPbTiO_3 \quad (1)$$

where in formula (1), $0<x,y,z<1$ and $x+y+z=1$.

Regarding plane orientation, the crystal structure of the piezoelectric layer is assumed to be pseudo-cubic. This is for the sake of simplifying explanation because it is difficult to accurately identify the crystal structure of a thin film piezoelectric layer. However, regarding the plane orientation, even though the crystal structure of the piezoelectric layer is assumed to be pseudo-cubic, the crystal structure of the piezoelectric layer may be an $ABO_3$ structure such as tetragonal, orthorhombic, monoclinic, or rhombohedral that is less symmetric than pseudo-cubic. For example, when the crystal structure of the piezoelectric layer is tetragonal, (100) orientation refers to both (001) orientation and (100) orientation.

According to an aspect of the piezoelectric element, in formula (1), $0.06≤x≤0.23$, $0.32≤y≤0.55$, and $0.32≤z≤0.54$.

According to an aspect of the piezoelectric element, the piezoelectric element may further include a layer that is disposed between the first electrode and the first piezoelectric layer and that contains titanium.

According to an aspect of the piezoelectric element, the second piezoelectric layer may be preferentially oriented to (100) when a crystal structure of the second piezoelectric layer is assumed to be pseudo-cubic.

According to an aspect of the present disclosure, a liquid ejecting head includes an aspect of the above-described piezoelectric element and a nozzle plate having a nozzle hole that ejects a liquid, in which the base body includes a pressure generation chamber, a volume of which is changed by the piezoelectric element and a flow-passage-forming substrate having a feed passage that feeds the liquid to the pressure generation chamber, and the nozzle hole is in communication with the pressure generation chamber.

According to an aspect of the present disclosure, a printer includes an aspect of the above-described liquid ejecting head, a transport mechanism that moves a recording medium relative to the liquid ejecting head, and a controller that controls the liquid ejecting head and the transport mechanism.

BRIEF DESCRIPTION OF THE DRAWINGS

FIG. 7 is a table illustrating the orientation ratio, the relative permittivity, and the amount of relative displacement of Examples 1 to 24 and Comparative Example 1.

DESCRIPTION OF EXEMPLARY EMBODIMENTS

A preferred embodiment according to the present disclosure will be described below in detail with reference to the drawings. In this regard, the embodiment described below does not unfairly limit the contents of the present disclosure described in the claims. In addition, none of the configurations described below are limited to be indispensable constituents of the present disclosure.

1. PIEZOELECTRIC ELEMENT

Figure 1:
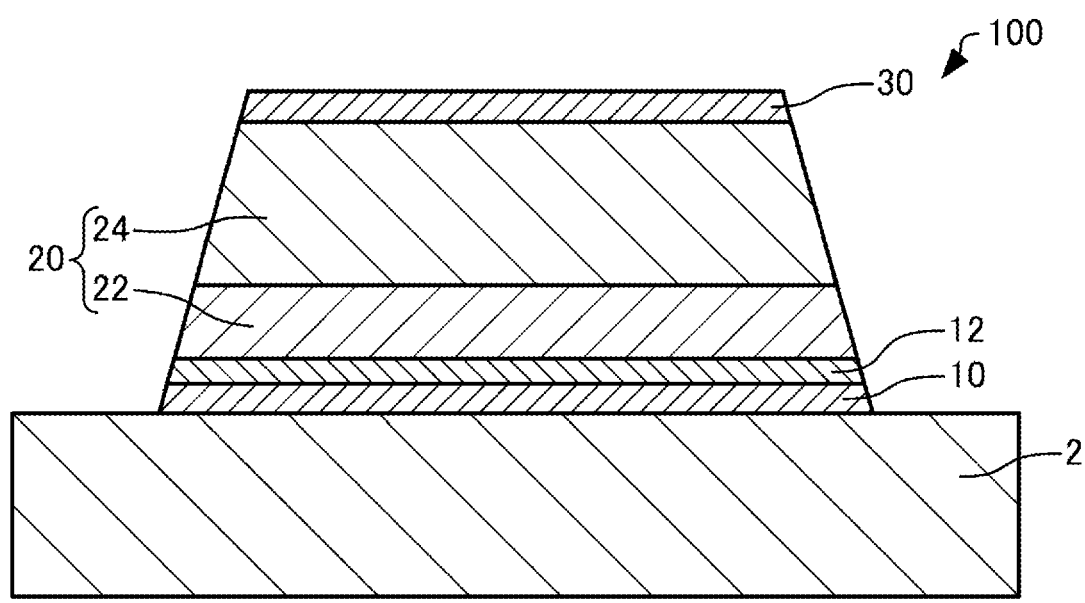
FIG. 1 is a schematic sectional view illustrating a piezoelectric element according to an embodiment.

A piezoelectric element according to the embodiment will be described with reference to the drawings. FIG. 1 is a schematic sectional view illustrating the piezoelectric element 100 according to the embodiment.

As illustrated in FIG. 1, the piezoelectric element 100 includes, for example, a first electrode 10, an orientation control layer 12, a piezoelectric layer 20, and a second electrode 30. The piezoelectric element 100 is disposed above a base body 2.

The base body 2 is a planar plate formed of a semiconductor, an insulator, or the like. The base body 2 may be a single layer or a multilayer body in which a plurality of layers are stacked. There is no particular limitation regarding the internal structure of the base body 2 provided that the upper surface has a planar shape, and a space or the like may be formed inside the structure.

The base body 2 may be a vibrating plate that has flexibility and that deforms in response to an action of the piezoelectric layer 20. Examples of the vibrating plate include a silicon oxide layer, a zirconium oxide layer, and a multilayer body in which a zirconium layer is disposed on a silicon oxide layer.

The first electrode 10 is disposed at the base body 2. In the example illustrated in the drawing, the first electrode 10 is disposed on the base body 2. The first electrode 10 is in the shape of, for example, a layer. The thickness of the first electrode 10 is, for example, 3 nm or more and 200 nm or less. The first electrode 10 is, for example, a metal layer such as a platinum layer, an iridium layer, or a ruthenium layer or a conductive oxide layer of any one or more of these, a lanthanum nickelate (LaNiO$_3$:LNO) layer, or a strontium ruthenate (SrRuO$_3$:SRO) layer. The first electrode 10 may have a structure in which a plurality of layers exemplified above are stacked.

The first electrode 10 is one of the electrodes for applying a voltage to the piezoelectric layer 20. The first electrode 10 is a lower electrode disposed under the piezoelectric layer 20.

Although not illustrated in the drawing, a first adhesive layer for enhancing adhesion between the first electrode 10 and the base body 2 may be disposed between the first electrode 10 and the base body 2. The first adhesive layer is, for example, a titanium layer or a titanium oxide layer. In this case, the first electrode 10 is disposed above the base body 2 with the first adhesive layer interposed therebetween.

The orientation control layer 12 is disposed on the first electrode 10. The orientation control layer 12 is disposed between the first electrode 10 and a first piezoelectric layer 22 of the piezoelectric layer 20. The thickness of the orientation control layer 12 is, for example, 3 nm or more and 200 nm or less. The orientation control layer 12 is a layer containing titanium and is, for example, a titanium layer or a titanium oxide layer. The orientation control layer 12 can control the orientation of the first piezoelectric layer 22.

The piezoelectric layer 20 is disposed on the orientation control layer 12. The piezoelectric layer 20 is disposed between the first electrode 10 and the second electrode 30. The thickness of the piezoelectric layer 20 is, for example, 500 nm or more and 2 μm or less. The piezoelectric layer 20 deforms in response to application of a voltage between the first electrode 10 and the second electrode 30.

The piezoelectric layer 20 includes the first piezoelectric layer 22 and a second piezoelectric layer 24.

The first piezoelectric layer 22 is disposed on the orientation control layer 12. The first piezoelectric layer 22 is disposed between the first electrode 10 and the second piezoelectric layer 24. In the example illustrated in the drawing, the thickness of the first piezoelectric layer 22 is less than the thickness of the second piezoelectric layer 24.

The first piezoelectric layer 22 contains a complex oxide having a perovskite structure that contains lead (Pb), zirconium (Zr), and titanium (Ti). The piezoelectric layer 20 is a PZT layer composed of PZT. The first piezoelectric layer 22 may contain additives other than lead, zirconium, titanium, and oxygen (O). That is, the first piezoelectric layer 22 may be a PZT layer containing additives. Although not illustrated in the drawing, the piezoelectric element 100 may include two PZT layers and a Ti layer interposed between the two PZT layers.

The second piezoelectric layer 24 is disposed on the first piezoelectric layer 22. The second piezoelectric layer 24 is disposed between the first piezoelectric layer 22 and the second electrode 30.

The second piezoelectric layer 24 contains a complex oxide having a perovskite structure that is denoted by formula (1) below. More specifically, the second piezoelectric layer 24 contains a complex oxide having a perovskite structure that is denoted by formula (2) below.

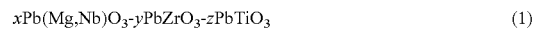

$$xPb(Mg,Nb)O_3\text{-}yPbZrO_3\text{-}zPbTiO_3 \qquad (1)$$

$$xPb(Mg_{1/3},Nb_{2/3})O_3\text{-}yPbZrO_3\text{-}zPbTiO_3 \qquad (2)$$

In this regard, in formulae (1) and (2), $0<x,y,z<1$ and $x+y+z=1$. In formulae (1) and (2), $0.06 \leq x \leq 0.23$, $0.32 \leq y \leq 0.55$, and $0.32 \leq z \leq 0.54$ are preferable.

As described above, the second piezoelectric layer 24 is a PMN-PZT layer in which lead magnesium niobate (Pb(Mg,Nb)O$_3$:PMN), lead titanate (PbTiO$_3$:PT), and lead zirconate (PbZrO$_3$:PZ) form a solid solution. The second piezoelectric layer 24 may contain additives other than lead, magnesium, niobium, zirconium, titanium, and oxygen. That is, the second piezoelectric layer 24 may be a PMN-PZT layer containing additives.

The first piezoelectric layer 22 is preferentially oriented to (100) when the crystal structure of the first piezoelectric layer 22 is assumed to be pseudo-cubic. The second piezoelectric layer 24 is preferentially oriented to (100) when the crystal structure of the second piezoelectric layer 24 is assumed to be pseudo-cubic. Here, "being preferentially oriented to (100)" refers to an orientation ratio F denoted by formula (3) below being 70% or more, where regarding an X-ray profile obtained by X-ray diffraction (XRD) measurement, the peak intensity derived from the (100) plane is denoted as $I_{(100)}$, the peak intensity derived from the (110) plane is denoted as $I_{(110)}$, and the peak intensity derived from the (111) plane is denoted as $I_{(111)}$. In this regard, F is called an orientation ratio that is simply an evaluation index and does not represent the volume fraction of the orientation of the piezoelectric layer 20.

$$F = I_{(100)}/(I_{(100)}+I_{(110)}+I_{(111)}) \times 100 \qquad (3)$$

The second electrode 30 is disposed on the piezoelectric layer 20. Although not illustrated in the drawing, the second electrode 30 may be additionally disposed on the side surface of the piezoelectric layer 20 and the base body 2 provided that the second electrode 30 is electrically isolated from the first electrode 10.

The second electrode 30 is in the shape of, for example, a layer. The thickness of the second electrode 30 is, for example, 15 nm or more and 300 nm or less. The second electrode 30 is, for example, a metal layer such as an iridium layer, a platinum layer, or a ruthenium layer or a conductive oxide layer of any one or more of these, a lanthanum nickelate layer, or a strontium ruthenate layer. The second electrode 30 may have a structure in which a plurality of layers exemplified above are stacked.

The second electrode 30 is the other of the electrodes for applying a voltage to the piezoelectric layer 20. The second electrode 30 is an upper electrode disposed on the piezoelectric layer 20.

The piezoelectric element 100 has, for example, the following features.

In the piezoelectric element 100, the piezoelectric layer 20 includes the first piezoelectric layer 22 containing a complex oxide having a perovskite structure that contains lead, zirconium, and titanium and the second piezoelectric layer 24 containing a complex oxide having a perovskite structure that is denoted by formula (1). The first piezoelectric layer 22 is disposed between the first electrode 10 and the second piezoelectric layer 24 and is preferentially oriented to (100) when the crystal structure of the first piezoelectric layer 22 is assumed to be pseudo-cubic. Consequently, as described later in "5. Examples and Comparative Examples", in the piezoelectric element 100, the piezoelectric layer 20 tends to be oriented and can have a high orientation ratio compared with when the first piezoelectric layer is not disposed between the first electrode and the second piezoelectric layer. Therefore, in the piezoelectric element 100, occurrence of cracking can be reduced in the piezoelectric layer 20. Further, a leakage current can be reduced. As a result, the reliability can be improved.

Regarding the piezoelectric element 100, in formula (1), $0.06 \leq x \leq 0.23$, $0.32 \leq y \leq 0.55$, and $0.32 \leq z \leq 0.54$. Consequently, as described later in "5. Examples and Comparative Examples", the piezoelectric element 100 can have good piezoelectric characteristics compared with when x, y, and z are out of the above-described ranges.

The piezoelectric element 100 includes the orientation control layer 12 that is disposed between the first electrode 10 and the first piezoelectric layer 22 and that contains titanium. Consequently, in the piezoelectric element 100, the first piezoelectric layer 22 further tends to be preferentially oriented to (100).

2. METHOD FOR MANUFACTURING PIEZOELECTRIC ELEMENT

Next, a method for manufacturing the piezoelectric element 100 according to the embodiment will be described with reference to the drawings.

As illustrated in FIG. 1, the base body 2 is prepared. Specifically, a silicon oxide layer is formed by thermal oxidation of a silicon substrate. Subsequently, a zirconium layer is formed on the silicon oxide layer by a sputtering method or the like, and a zirconium oxide layer is formed by thermal oxidation of the zirconium layer. The base body 2 may be prepared by the above-described steps.

The first electrode 10 is formed on the base body 2. The first electrode 10 is formed by, for example, a sputtering method, a vacuum evaporation method, or the like. The orientation control layer 12 is formed on the first electrode 10. The orientation control layer 12 is formed by, for example, a sputtering method, a vacuum evaporation method, or the like. The orientation control layer 12 and the first electrode 10 are patterned by photolithography and etching. In this regard, the first electrode 10 and the orientation control layer 12 may be separately patterned in respective steps different from each other.

The piezoelectric layer 20 is formed on the orientation control layer 12. The piezoelectric layer 20 is formed by, for example, a sol-gel method or a chemical solution deposition (CSD) method such as metal organic deposition (MOD). The method for forming the piezoelectric layer 20 will be described below.

A first precursor solution is prepared by dissolving or dispersing a metal complex containing lead, a metal complex containing zirconium, and a metal complex containing titanium in an organic solvent. A second precursor solution is prepared by dissolving or dispersing a metal complex containing lead, a metal complex containing zirconium, a metal complex containing titanium, a metal complex containing magnesium, and a metal complex containing niobium in an organic solvent.

Examples of the metal complex containing lead include lead acetate. Examples of the metal complex containing zirconium include zirconium butoxide, zirconium acetylacetonate, zirconium tetraacetylacetonate, zirconium monoacetylacetonate, and zirconium bisacetylacetonate. Examples of the metal complex containing titanium include titanium tetra-i-propoxide. Examples of the metal complex containing magnesium include magnesium acetate. Examples of the metal complex containing niobium include pentabutoxy niobium and niobium penta-n-propoxide.

Examples of the solvent of the metal complex include propanol, butanol, pentanol, hexanol, octanol, polyethylene glycol, propylene glycol, octane, decane, cyclohexane, xylene, toluene, tetrahydrofuran, acetic acid, octylic acid, 2-n-butoxyethanol, and n-octane or mixed solvents of these.

A first precursor layer is formed by coating the orientation control layer 12 with the prepared first precursor solution by a spin coating method or the like. The first precursor layer is dried by, for example, performing heating at 130° C. or higher and 250° C. or lower for a predetermined time. The dried first precursor layer is degreased by, for example, performing heating at 300° C. or higher and 550° C. or lower and holding for a predetermined time. The degreased first precursor layer is crystallized by, for example, performing firing at 700° C. or higher and 800° C. or lower. In this manner, the first piezoelectric layer 22 may be formed.

A second precursor layer is formed by coating the first piezoelectric layer 22 with the prepared second precursor solution by a spin coating method or the like. The second precursor layer is dried by, for example, performing heating at 130° C. or higher and 250° C. or lower for a predetermined time. The second precursor layer is degreased by, for example, performing heating at 300° C. or higher and 550° C. or lower and holding for a predetermined time. The degreased second precursor layer is crystallized by, for example, performing firing at 700° C. or higher and 800° C. or lower. A series of the above-described steps from coating with the second precursor solution to firing the second precursor layer is repeated a plurality of times. In this manner, the piezoelectric layer 20 including the first piezoelectric layer 22 and the second piezoelectric layer 24 may be formed.

A heating apparatus used for drying and degreasing the first precursor layer and the second precursor layer is, for example, a hot plate. A heating apparatus used for firing the first precursor layer and the second precursor layer is an infrared lamp annealing (rapid thermal annealing: RTA) apparatus.

The second electrode 30 is formed on the piezoelectric layer 20. The second electrode 30 is formed by, for example, a sputtering method, a vacuum evaporation method, or the like. The second electrode 30 and the piezoelectric layer 20 are patterned by photolithography and etching. In this regard, the second electrode 30 and the piezoelectric layer 20 may be separately patterned in respective steps different from each other.

The piezoelectric element 100 may be produced by the above-described steps.

In this regard, the piezoelectric layer 20 may be formed by a laser abrasion method, a sputtering method, a pulse-laser-deposition (PLD) method, a chemical vapor deposition (CVD) method, or an aerosol-deposition method rather than by the CSD method.

3. LIQUID EJECTING HEAD

Figure 2:
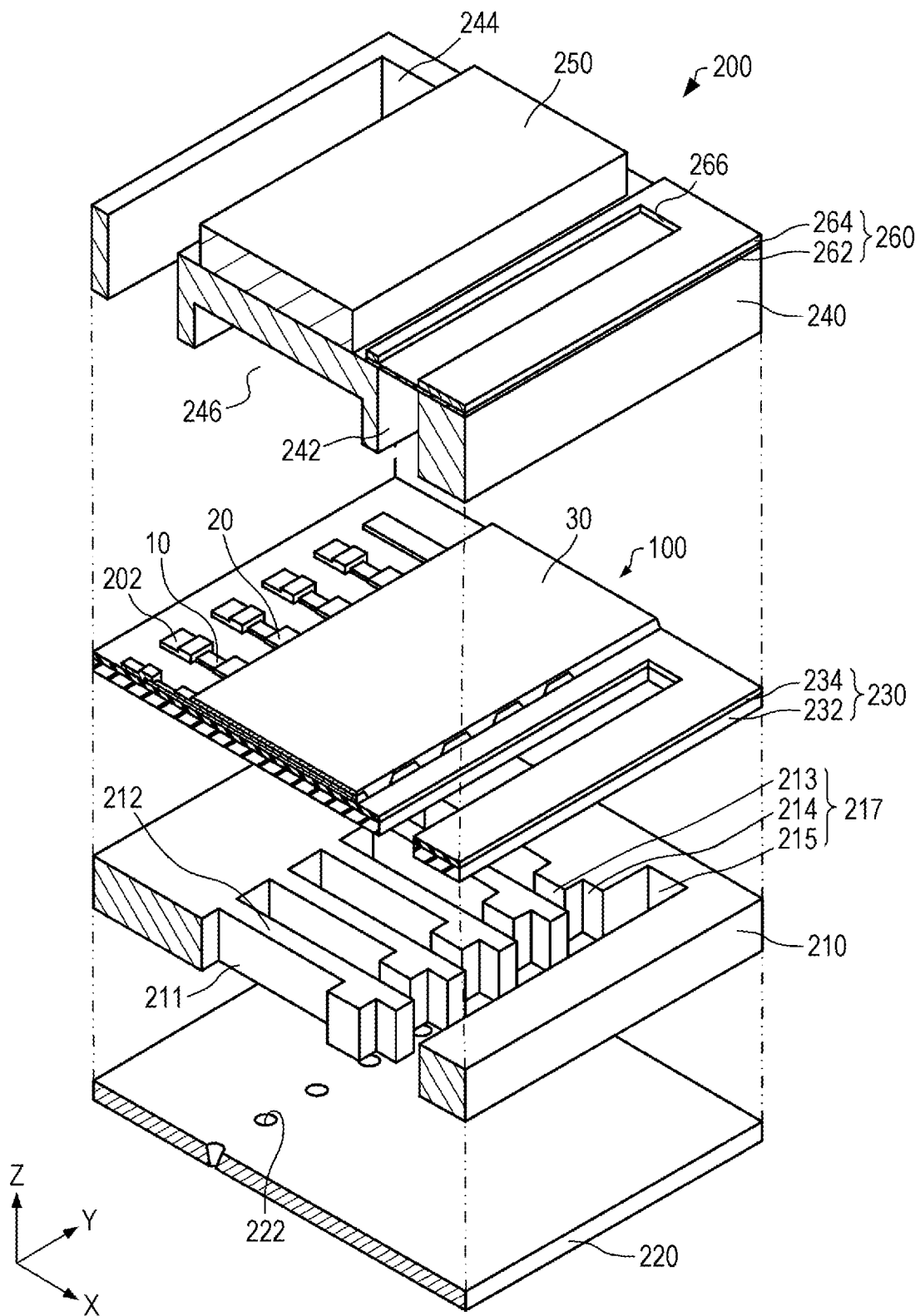
FIG. 2 is a schematic exploded perspective view illustrating a liquid ejecting head according to the embodiment.
Figure 3:
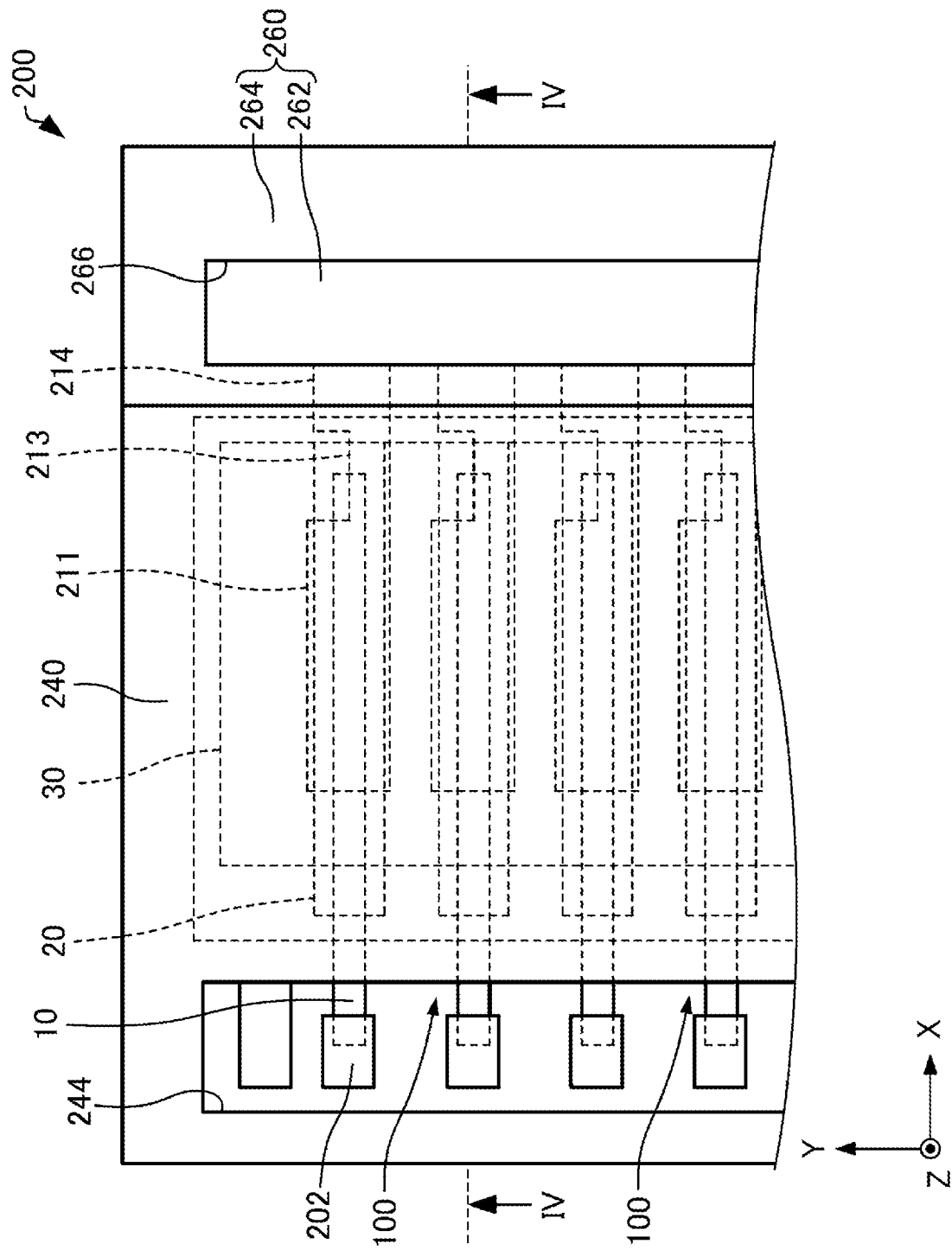
FIG. 3 is a schematic plan view illustrating the liquid ejecting head according to the embodiment.
Figure 4:
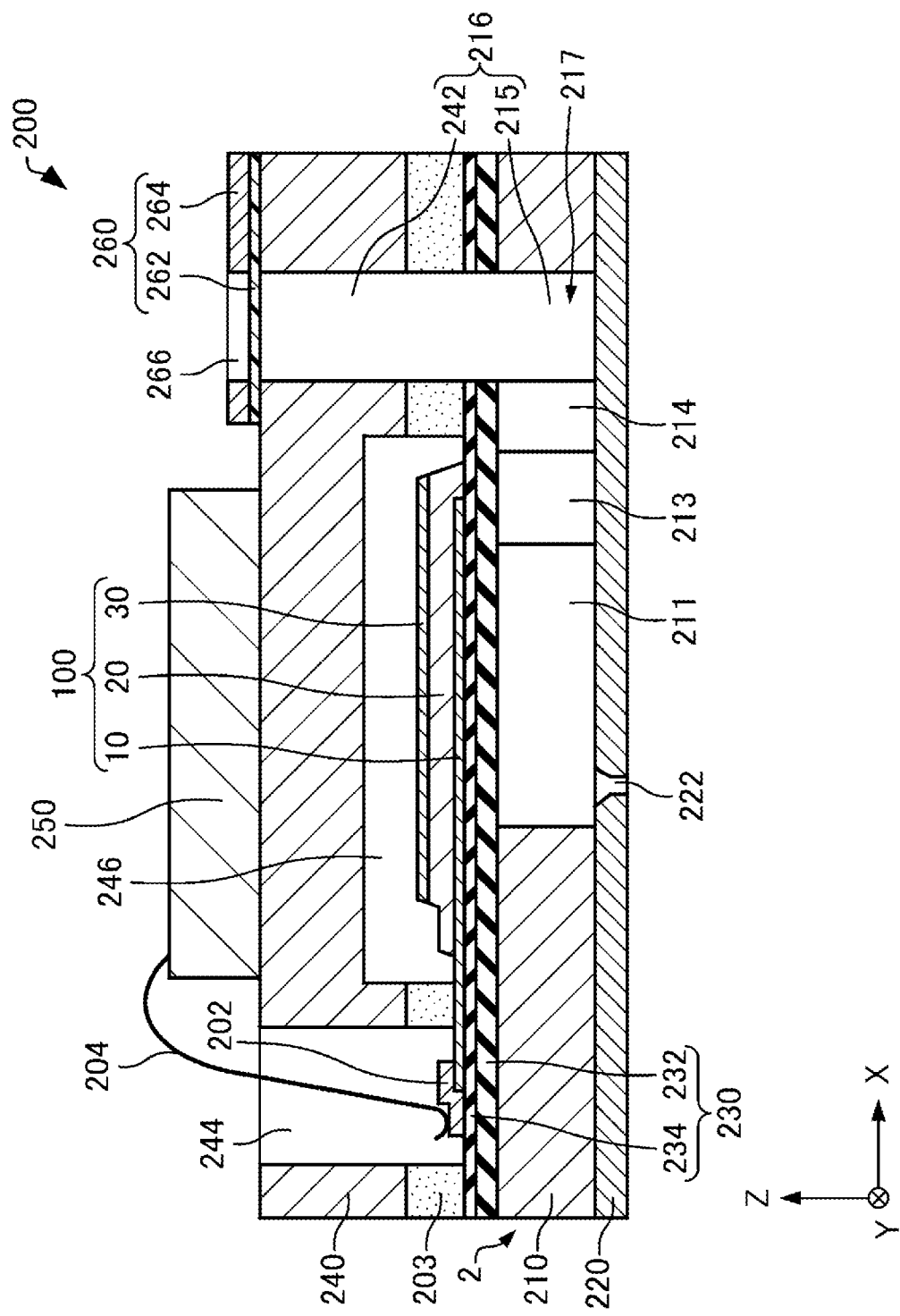
FIG. 4 is a schematic sectional view illustrating the liquid ejecting head according to the embodiment.

Next, a liquid ejecting head according to the embodiment will be described with reference to the drawings. FIG. 2 is a schematic exploded perspective view illustrating the liquid ejecting head 200 according to the embodiment. FIG. 3 is a schematic plan view illustrating the liquid ejecting head 200 according to the embodiment. FIG. 4 is a schematic sectional view cut along line IV-IV in FIG. 3 and illustrating the liquid ejecting head 200 according to the embodiment. In FIG. 2 to FIG. 4, the X-axis, the Y-axis, and the Z-axis are illustrated as three axes orthogonal to each other. In FIG. 2 to FIG. 4, a simplified piezoelectric element 100 is illustrated.

As illustrated in FIG. 2 to FIG. 4, the liquid ejecting head 200 includes, for example, the base body 2, the piezoelectric element 100, a nozzle plate 220, a protective substrate 240, a circuit board 250, and a compliance substrate 260. The base body 2 includes a flow-passage-forming substrate 210 and a vibrating plate 230. For the sake of convenience, the circuit board 250 is not illustrated in FIG. 3.

The flow-passage-forming substrate 210 is, for example, a silicon substrate. A pressure generation chamber 211 is formed in the flow-passage-forming substrate 210. The pressure generation chamber 211 is partitioned by a plurality of partition walls 212. The volume of the pressure generation chamber 211 is changed by the piezoelectric element 100.

A first communication passage 213 and a second communication passage 214 are formed at the end portion in the positive X-axis direction of the pressure generation chamber 211 in the flow-passage-forming substrate 210. The first communication passage 213 is formed such that the area of the opening is reduced as a result of the end portion in the positive X-axis direction of the pressure generation chamber 211 being narrowed in the Y-axis direction. The size in the Y-axis direction of the second communication passage 214 is, for example, the same as the size in the Y-axis direction of the pressure generation chamber 211. A third communication passage 215 that is in communication with the plurality of second communication passages 214 is formed in the positive X-axis direction of the second communication passage 214. The third communication passage 215 constitutes part of a manifold 216. The manifold 216 serves as a liquid chamber common to the respective pressure generation chambers 211. In this manner, the flow-passage-forming substrate 210 includes the pressure generation chamber 211 and the feed passage 217 composed of the first communication passage 213, the second communication passage 214, and the third communication passage 215. The feed passage 217 is in communication with the pressure generation chamber 211 and feeds the liquid to the pressure generation chamber 211.

The nozzle plate 220 is disposed at one surface of the flow-passage-forming substrate 210. The material of the nozzle plate 220 is, for example, stainless steel (SUS). The nozzle plate 220 is bonded to the flow-passage-forming substrate 210 by using an adhesive or a heat-welding film. The nozzle plate 220 has a plurality of nozzle holes 222 in the Y-axis direction. The nozzle holes 222 are in communication with the pressure generation chambers 211 and eject a liquid.

The vibrating plate 230 is disposed at the other surface of the flow-passage-forming substrate 210. The vibrating plate 230 is composed of, for example, a silicon oxide layer 232 disposed on the flow-passage-forming substrate 210 and a zirconium oxide layer 234 disposed on the silicon oxide layer 232.

A plurality of piezoelectric elements 100 are disposed on, for example, the vibrating plate 230. There is no particular limitation regarding the number of the piezoelectric elements 100.

In the liquid ejecting head 200, the vibrating plate 230 and the first electrode 10 are displaced owing to deformation of the piezoelectric layer 20 having electromechanical conversion characteristics. That is, in the liquid ejecting head 200, the vibrating plate 230 and the first electrode 10 substantially have a vibrating-plate function. In this regard, the vibrating plate 230 may be omitted and the first electrode 10 alone may function as a vibrating plate. When the first electrode 10 is directly disposed on the flow-passage-forming substrate 210, the first electrode 10 may be protected by an insulating protective film or the like so as to prevent the liquid from coming into contact with the first electrode 10.

The first electrode 10 is configured as an individual independent electrode for each pressure generation chamber 211. The size in the Y-axis direction of the first electrode 10 is smaller than the size in the Y-axis direction of the pressure generation chamber 211. The size in the X-axis direction of the first electrode 10 is greater than the size in the X-axis direction of the pressure generation chamber 211. In the X-axis direction, both end portions of the first electrode 10 are located outside the respective end portions of the pressure generation chamber 211. A lead electrode 202 is coupled to the end portion in the negative X-axis direction of the first electrode 10.

The size in the Y-axis direction of the piezoelectric layer 20 is greater than, for example, the size in the Y-axis direction of the first electrode 10. The size in the X-axis direction of the piezoelectric layer 20 is greater than the size in the X-axis direction of the pressure generation chamber 211. The end portion in the positive X-axis direction of the piezoelectric layer 20 is located, for example, outside the end portion in the positive X-axis direction of the first electrode 10. The end portion in the positive X-axis direction of the first electrode 10 is covered by the piezoelectric layer 20. Meanwhile, the end portion in the negative X-axis direction of the piezoelectric layer 20 is located, for example, inside the end portion in the negative X-axis direction of the first electrode 10. The end portion in the negative X-axis direction of the first electrode 10 is not covered by the piezoelectric layer 20.

A second electrode 30 is continuously disposed on, for example, the piezoelectric layer 20 and the vibrating plate 230. The second electrode 30 is formed as a common electrode shared by the plurality of piezoelectric elements 100.

A protective substrate 240 is bonded to the flow-passage-forming substrate 210 by using an adhesive 203. The protective substrate 240 has a through hole 242. In the example illustrated in the drawings, the through hole 242 penetrates the protective substrate 240 in the Z-axis direction and is in communication with the third communication passage 215.

The through hole 242 and the third communication passage 215 constitute the manifold 216 serving as a liquid chamber common to the respective pressure generation chambers 211. Further, the protective substrate 240 has a through hole 244 that penetrates the protective substrate 240 in the Z-axis direction. The end portion of the lead electrode 202 is located in the through hole 244.

An opening portion 246 is formed in the protective substrate 240. The opening portion 246 is a space for preventing the operation of the piezoelectric element 100 from being hindered. The opening portion 246 may be sealed or may not be sealed.

The circuit board 250 is disposed on the protective substrate 240. The circuit board 250 includes a semiconductor integrated circuit (IC) for operating the piezoelectric element 100. The circuit board 250 is electrically coupled to the lead electrode 202 through a coupling wire 204.

The compliance substrate 260 is disposed on the protective substrate 240. The compliance substrate 260 includes a seal layer 262 disposed on the protective substrate 240 and a fixing plate 264 disposed on the seal layer 262. The seal layer 262 is a layer for sealing the manifold 216. The seal layer 262 has, for example, flexibility. The fixing plate 264 has a through hole 266. The through hole 266 penetrates the fixing plate 264 in the Z-axis direction. The through hole 266 is formed at a location overlapping the manifold 216 when viewed in the Z-axis direction.

4. PRINTER

Figure 5:
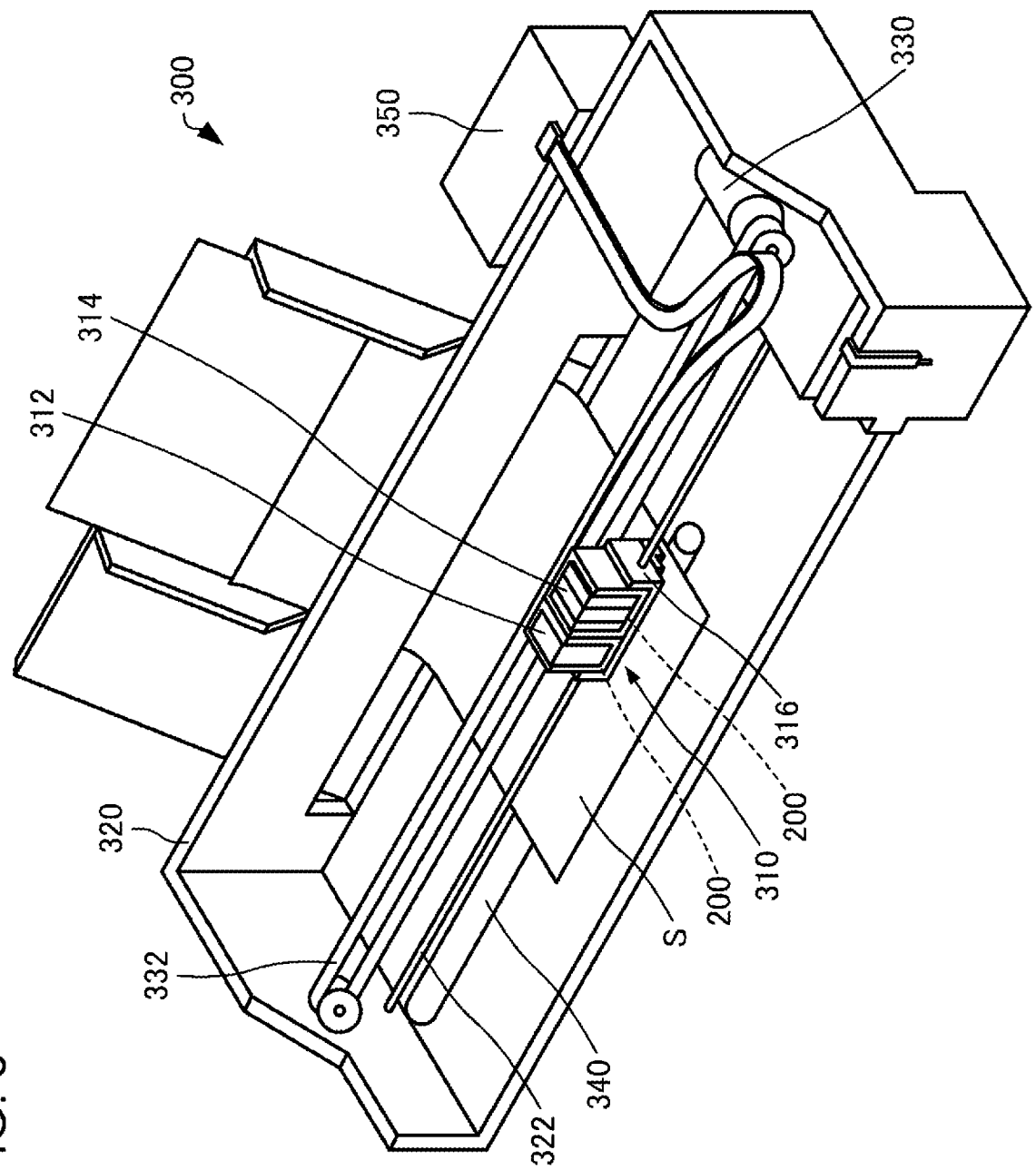
FIG. 5 is a schematic perspective view illustrating a printer according to the embodiment.

Next, a printer according to the embodiment will be described with reference to the drawing. FIG. 5 is a schematic perspective view illustrating the printer 300 according to the embodiment.

The printer 300 is an ink jet printer. As illustrated in FIG. 5, the printer 300 includes a head unit 310. The head unit 310 includes, for example, a liquid ejecting head 200. There is no particular limitation regarding the number of the liquid ejecting heads 200. Cartridges 312 and 314 constituting a feed device are detachably attached to the head unit 310. A carriage 316 on which the head unit 310 is mounted is disposed on a carriage shaft 322, being attached to an apparatus main body 320, so as to be freely movable in the shaft direction, and the liquid fed from the liquid feed device is ejected.

In this regard, the liquid has to be a material in the state in which a substance is in a liquid phase, and a material in a liquid state such as sol or gel is also included in the liquid. Not only the liquid in a state of a substance but also a material in which particles of a functional material composed of solids such as pigment particles or metal particles are dissolved, dispersed, or mixed in a solvent is included in the liquid. Representative examples of the liquid include inks and liquid crystal emulsifiers. The inks include common aqueous inks and oil-based inks and various liquid compositions, for example, gel inks and hot-melt inks.

In the printer 300, the carriage 316 on which the head unit 310 is mounted is moved along the carriage shaft 322 by the driving force of the driving motor 330 being transmitted to the carriage 316 with a plurality of gears, not illustrated in the drawing, and a timing belt 332 interposed therebetween. Meanwhile, the apparatus main body 320 includes a transport roller 340 serving as a transport mechanism that moves sheet S such as a recording medium, for example, paper, relative to the liquid ejecting head 200. The transport mechanism that moves sheet S is not limited to the transport roller and may be a belt, a drum, or the like.

The printer 300 includes a printer controller 350 serving as a controller that controls the liquid ejecting head 200 and the transport roller 340. The printer controller 350 is electrically coupled to the circuit board 250 of the liquid ejecting head 200. The printer controller 350 is provided with, for example, a random access memory (RAM) that temporarily stores various data, a read only memory (ROM) that stores control programs and the like, a central processing unit (CPU), and a driving-signal-generation circuit that generates a driving signal to be supplied to the liquid ejecting head 200.

The piezoelectric element 100 may be used for not only liquid ejecting heads and printers but also wide-range applications. The piezoelectric element 100 may suitably be used as, for example, piezoelectric actuators of ultrasonic motors, vibration dust removal apparatuses, piezoelectric transformers, piezoelectric speakers, piezoelectric pumps, pressure-electric converters, or the like. In addition, the piezoelectric element 100 may suitably be used as, for example, piezoelectric sensor elements of ultrasonic detectors, angular velocity sensors, acceleration sensors, vibration sensors, tilt sensors, pressure sensors, collision sensors, motion sensors, infrared sensors, terahertz sensors, thermal detection sensors, pyroelectric sensors, piezoelectric sensors, or the like. Further, the piezoelectric element 100 may suitably be used as, for example, ferroelectric elements of ferroelectric memories (FeRAM), ferroelectric transistors (FeFET), ferroelectric arithmetic circuits (FeLogic), ferroelectric capacitors, or the like. The piezoelectric element 100 may suitably be used as, for example, voltage-control optical elements of wavelength converters, optical waveguides, optical path modulators, refractive-index control elements, electronic shutter mechanisms, or the like.

5. EXAMPLES AND COMPARATIVE EXAMPLES

The present disclosure will be more specifically described below with reference to Examples and Comparative Examples. In this regard, the present disclosure is not restricted by the following Examples and Comparative Examples.

5.1. Production of Sample

5.1.1. Example 1

In Example 1, a silicon dioxide layer was formed on a silicon substrate by thermally oxidizing a 6-inch silicon substrate. A zirconium layer was formed on the silicon dioxide layer by a sputtering method, and a zirconium oxide layer was formed by performing thermal oxidation. A titanium layer, a platinum layer, an iridium layer, and a titanium layer were formed in this order on the zirconium oxide layer by the sputtering method to form an adhesive layer composed of a titanium layer, a first electrode composed of the platinum layer and the iridium layer, and an orientation-control layer composed of the titanium layer.

A piezoelectric layer was formed on the orientation control layer in the following procedure.

Acetic acid and water were measured and taken into a container, and lead acetate, zirconium butoxide, titanium tetra-i-propoxide, and polyethylene glycol were also measured and taken into the container. These were heated and agitated at 90° C. to produce a PZT precursor solution.

Meanwhile, 2-butoxyethanol, dimethylaminoethanol, and polyethylene glycol were measured and taken into a container, and lead acetate, magnesium acetate, pentabutoxyniobium, zirconium butoxide, and titanium tetra-i-propoxide were also measured and taken into the container. Heating and agitation were performed at room temperature to produce a PMN-PZT precursor solution.

The first electrode was coated with the PZT precursor solution by the spin coating method to form a PZT precursor layer. The PZT precursor layer was heated at 155° C., 275° C., and 530° C. successively. Thereafter, firing was performed at 737° C. by using an RTA apparatus to form a PZT layer composed of PZT.

The PZT layer was coated with the PMN-PZT precursor solution by the spin coating method to form a PMN-PZT precursor layer. The PMN-PZT precursor layer was heated at 155° C., 275° C., and 530° C. successively. Thereafter, firing was performed at 750° C. by using the RTA apparatus. A series of the steps from coating with the PMN-PZT precursor solution to firing was repeated 5 times to form a PMN-PZT layer composed of PMN-PZT.

In this manner, the piezoelectric layer including the PZT layer and the PMN-PZT layer was formed.

Subsequently, an Ir layer was formed on the PMN-PZT layer by the sputtering method, and the Ir layer was patterned into a predetermined shape by photolithography and dry etching to form a second electrode. Further, the piezoelectric layer was patterned into a predetermined shape.

Next, a piezoelectric element was produced by cutting and dividing the silicon substrate by using a rotary dicing apparatus.

5.1.2. Comparative Example 1

In Comparative Example 1, a piezoelectric element was produced by the same steps as in Example 1 except that a series of the steps from coating with the PZT precursor solution to firing was repeated 4 times and the PMN-PZT layer was not formed. That is, in Comparative Example 1, the piezoelectric layer was the PZT layer.

5.1.3. Comparative Example 2

In Comparative Example 2, a piezoelectric element was produced by the same steps as in Example 1 except that the PZT layer was not formed. That is, in Comparative Example 2, the piezoelectric layer was the PMN-PZT layer.

5.2. XRD Measurement

In Example 1 and Comparative Examples 1 and 2, after the piezoelectric layer was formed, an XRD measurement was performed by using D8 Discover produced by Bruker AXS. Regarding the radiation source, CuKα rays were used at an acceleration voltage of 100 V and an acceleration current of 50 mA, and a two-dimensional detector GADDS was used as a detector. The measurement was performed within the range of $2\theta = 20°$ to $50°$ by a $2\theta\text{-}\omega$ method.

In this regard, the PZT layer is assumed to be pseudo-cubic. This is because the PZT layer has a crystal structure that is any one or more of rhombohedral, tetragonal, and monoclinic and it is very difficult to accurately identify the crystal structure since the PZT layer is thin film ceramic. Likewise, identification of the crystal structure of the PMN-PZT layer is very difficult and the PMN-PZT layer is also assumed to be pseudo-cubic.

In this regard, the crystal structure of the piezoelectric layer is assumed to be pseudo-cubic for the sake of simplifying analysis. However, even when the crystal structure of the piezoelectric layer is one or more of the above-described crystal structures that are less symmetric, the analytical results and effects derived therefrom are not affected.

According to the XRD measurement results of Example 1 and Comparative Examples 1 and 2, merely a peak derived from the piezoelectric layer having an $ABO_3$ perovskite structure, a peak derived from the first electrode, and a peak derived from the substrate under the first electrode were observed, and a heterogeneous phase or the like was not observed.

According to the XRD measurement results of Example 1 and Comparative Example 1, in the two-dimensional image, a spot-like intense peak derived from the (100) plane was observed. Consequently, it was found that the piezoelectric layers according to Example 1 and Comparative Example 1 were preferentially oriented to (100).

Figure 6:
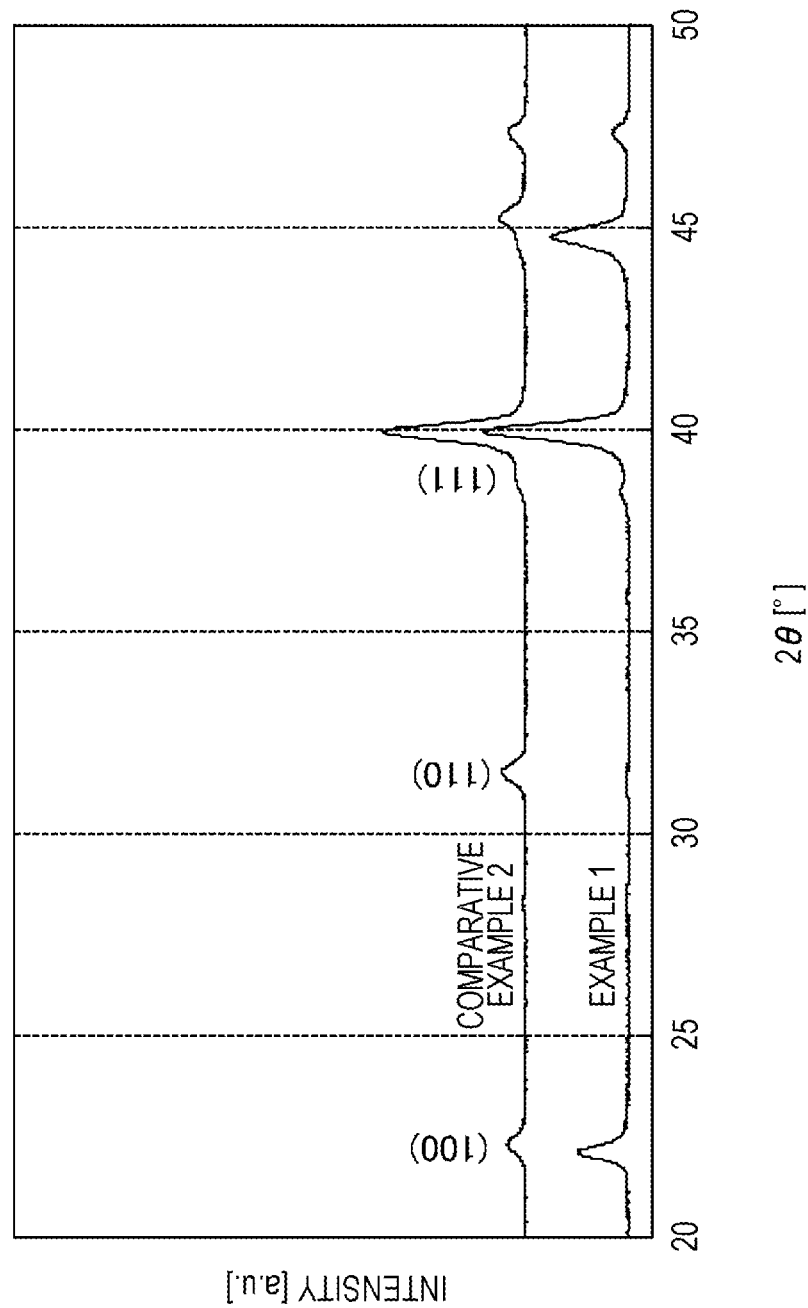
FIG. 6 is a diagram illustrating the XRD measurement results of Example 1 and Comparative Example 2.

FIG. 6 is a diagram illustrating the XRD measurement results of Example 1 and Comparative Example 2. Regarding Example 1, it was found that the orientation ratio F denoted by formula (3) above was 92.8% and that the piezoelectric layer was preferentially oriented to (100). Meanwhile, regarding Comparative Example 2, the intensity of the peak derived from the (110) plane was higher than the intensity of the peak derived from the (100) plane, the orientation ratio F was less than 50.0%, and both peaks were line-like in the two-dimensional image. Consequently, it was found that the PMN-PZT layer was not oriented unless there was a PZT layer under the PMN-PZT layer.

FIG. 7 is a table showing the orientation ratios F of Examples 1 to 24 and Comparative Example 1. As illustrated in FIG. 7, it was found that, when the PMN-PZT layer was disposed on the PZT layer, the orientation ratio F was 75% or more. In this regard, in Examples 2 to 24, the piezoelectric element was produced by performing the same steps as in Example 1 except that the mixing ratio of the metal complexes was changed when the PMN-PZT precursor solution was produced. In Examples 2 to 24, the XRD measurement was performed as in Example 1.

5.3. Measurement of Amount of Displacement

In order to evaluate the piezoelectric characteristics regarding Examples 1 to 24 and Comparative Example 1, the amount of displacement was measured by using a cantilever having a strip cantilever structure. NLV-2500 produced by Polytec was used, and the amount of displacement when a Sin wave with 1 kHz and 11 V±11 V was applied. Regarding the cantilever, the length was set to be 25 mm relative to the fixed end, the width was set to be 4 mm, and the plate thickness was set to be 0.4 mm. The second electrode was set to have a length of 15 mm and a width of 2 mm on the cantilever and was set to be a fine wire portion such that displacement was not affected.

FIG. 7 shows the amount of relative displacement of Examples 1 to 24 and Comparative Example 1. The amount of relative displacement refers to a value that was normalized with reference to Comparative Example 1. As illustrated in FIG. 7, regarding Examples 1, 3 to 5, 7 to 11, and 13 to 18, the amount of relative displacement was more than 1.00. Therefore, it was found that good piezoelectric characteristics were realized when $0.06 \leq x \leq 0.23$, $0.32 \leq y \leq 0.55$, and $0.32 \leq z \leq 0.54$ in formula (1) above.

Figure 8:
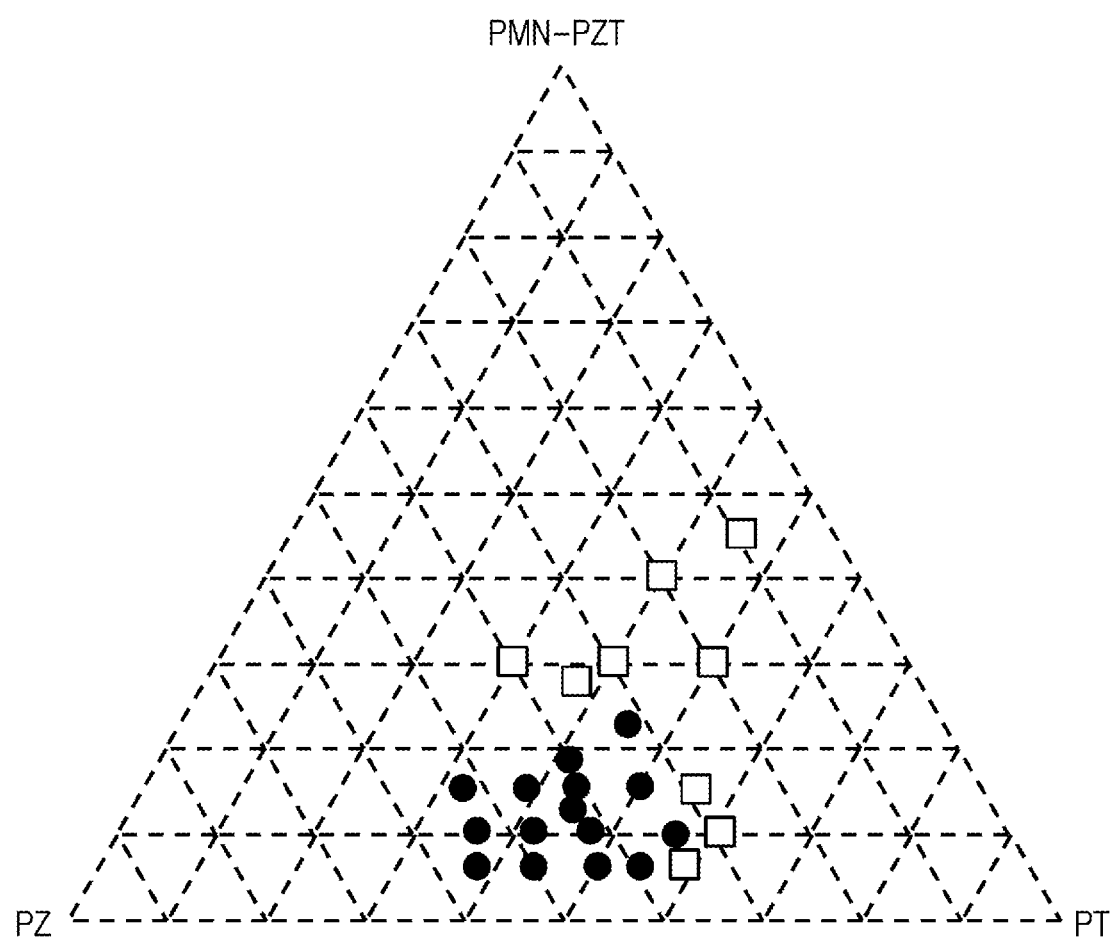
FIG. 8 is a schematic diagram illustrating a ternary phase diagram of PMN-PZT, PZ, and PT.

FIG. 8 is a schematic diagram illustrating a ternary phase diagram of PMN-PZT, PZ, and PT. In FIG. 8, points corresponding to Examples 1, 3 to 5, 7 to 11, and 13 to 18 are indicated by black circles, and points corresponding to Examples 2, 6, 12, and 19 to 24 are indicated by outline squares.

5.4. Measurement of Relative Permittivity

In order to measure the relative permittivity of Examples 1 to 24 and Comparative Example 1, Impedance Analyzer 4294A produced by Agilent was used and the capacitance was measured. The measurement was performed by applying an alternating current with a frequency of 1 kHz and an amplitude of ±500 mV to a circular second electrode with a diameter of 500 μm at a DC voltage of 10 V. The relative permittivity was calculated from the resulting capacitance and the electrode area.

As shown by formula (4) below, in general, the piezoelectric constant increases as the relative permittivity increases.

$$d_{31} = k_{31}\sqrt{\frac{\varepsilon_{33}}{Y}} \quad (4)$$

In formula (4), $d_{31}$ represents a piezoelectric constant, $k_{31}$ represents an electromechanical coupling coefficient, $\varepsilon_{33}$ represents a relative permittivity, and Y represents a Young's modulus.

As shown in FIG. 7, regarding Examples 1, 3 to 5, 7 to 11, and 13 to 18, the relative permittivity was less than the relative permittivity of Comparative Example 1 even though the amount of relative displacement was more than the amount of relative displacement of Comparative Example 1. When the relative permittivity decreases while the amount of relative displacement increases or is maintained, the power consumption and the amount of heat generated decrease during the same operation. Consequently, regarding Examples 1, 3 to 5, 7 to 11, and 13 to 18, effects of improving designability and improving reliability due to a reduction in power consumption, a reduction in environmental load, and a reduction in heat generation can be obtained.

The present disclosure is not limited to the above-described embodiment and various modifications can be made. For example, the present disclosure includes substantially the same configuration as the configuration described in the embodiment. Examples of substantially the same configuration include a configuration having the same function, method, and result and a configuration having the same purpose and effect. The present disclosure includes a configuration in which a nonessential portion of the configuration described in the embodiment is replaced. The present disclosure includes a configuration that has the same operations and advantages as those of the configuration described in the embodiment or that may achieve the same purpose. The present disclosure includes a configuration in which a known technology is added to the configuration described in the embodiment.

What is claimed is:

1. A piezoelectric element comprising:
a first electrode disposed at a base body;
a second electrode; and
a piezoelectric layer disposed between the first electrode and the second electrode, wherein
the piezoelectric layer includes
a first piezoelectric layer containing a complex oxide having a perovskite structure that contains lead, zirconium, and titanium and
a second piezoelectric layer containing a complex oxide having a perovskite structure that is denoted by formula (1) below, and
the first piezoelectric layer is disposed between the first electrode and the second piezoelectric layer and is preferentially oriented to (100) when a crystal structure of the first piezoelectric layer is assumed to be pseudo-cubic, $$x\text{Pb}(\text{Mg},\text{Nb})\text{O}_3\text{-}y\text{PbZrO}_3\text{-}z\text{PbTiO}_3 \quad (1)$$

where in formula (1), 0.06≤x≤0.23, 0.32≤y≤0.55, and 0.32≤z≤0.54 and x+y+z=1.

2. The piezoelectric element according to claim 1, further comprising
a layer that is disposed between the first electrode and the first piezoelectric layer and that contains titanium.

3. The piezoelectric element according to claim 1, wherein
the second piezoelectric layer is preferentially oriented to (100) when a crystal structure of the second piezoelectric layer is assumed to be pseudo-cubic.

4. A liquid ejecting head comprising:
the piezoelectric element according to claim 1; and
a nozzle plate having a nozzle hole that ejects a liquid, wherein
the base body includes
a pressure generation chamber, a volume of which is changed by the piezoelectric element and
a flow-passage-forming substrate having a feed passage that feeds the liquid to the pressure generation chamber, and
the nozzle hole is in communication with the pressure generation chamber.

5. A printer comprising:
the liquid ejecting head according to claim 4;
a transport mechanism that moves a recording medium relative to the liquid ejecting head, and
a controller that controls the liquid ejecting head and the transport mechanism.

6. The piezoelectric element according to claim 1, further comprising
a layer that is interposed between the first piezoelectric layer and the second piezoelectric layer and that contains titanium.

7. The piezoelectric element according to claim 1, wherein
the second electrode is disposed on a top surface of the piezoelectric layer and
additionally disposed on a side surface of the piezoelectric layer.

* * * * *